United States Patent [19]
Charrier

[11] Patent Number: 5,994,689
[45] Date of Patent: Nov. 30, 1999

[54] PHOTOELECTRIC CELL WITH STABILISED AMPLIFICATION

[75] Inventor: Pierre Charrier, Migne-Auxances, France

[73] Assignee: Schneider Electric SA, Boulogne Billancourt, France

[21] Appl. No.: 08/984,063

[22] Filed: Dec. 3, 1997

[30] Foreign Application Priority Data

Dec. 3, 1996 [FR] France .................................. 96 14914

[51] Int. Cl.⁶ .................................................. H01J 40/14
[52] U.S. Cl. ...................................... 250/214 A; 330/308
[58] Field of Search ........................... 250/214 A, 214 R, 250/214 AG; 330/59, 308; 359/189, 194

[56] References Cited

U.S. PATENT DOCUMENTS 3,739,177   6/1973   Ko .
4,851,689   7/1989   Hasegawa .
4,861,978   8/1989   Anderson .............................. 250/214 A

OTHER PUBLICATIONS

Patent Abstracts of Japan, vol. 17, No. 518 (E–1434), Sep. 17, 1993 and JP 05 136678 A, Jun. 1, 1993.

Toshifumi Fukuyama, "Ways to Prevent Malfunction in Photoelectric Switches", J.E.E. Journal of Electronic Engineering, vol. 21, No. 205, Jan. 1984, pp. 59–63.

*Primary Examiner*—Edward P. Westin
*Assistant Examiner*—Kevin Pyo
*Attorney, Agent, or Firm*—Oblon, Spivak, McClelland, Maier & Neustadt, P.C.

[57] ABSTRACT

A photoelectric cell having a receiving section fitted with an amplifier processing circuit for making the cell immune to electrical disturbances. The processing circuit uses a transfer impedance amplifier A having a gain loop 24 which is shunted by a short-circuit path 24A including a switch T1 controlled by the transmission signal E1. The switch T1 conducts when no pulses are delivered from the transmission signal E1 and does not conduct when pulses are received from the transmission signal E1.

3 Claims, 1 Drawing Sheet

PHOTOELECTRIC CELL WITH STABILISED AMPLIFICATION

BACKGROUND OF THE INVENTION

FIELD OF THE INVENTION

The present invention relates to a photoelectric cell comprising a transmitting assembly and an assembly for receiving an optical beam, the latter assembly supplying an output signal that switches when an object is placed in the path of the beam.

DISCUSSION OF THE BACKGROUND

The receiving assemblies of known photoelectric cells often comprise an amplifier that has an input for the reception signal and an output that supplies a voltage signal to a device that shapes the switching signal. To ensure that only useful signals are detected the amplifier output is sometimes fitted with a transistor that only conducts at a given range of transmitted pulses. However, external electrical disturbances sometimes occur just before the leading edge of a pulse, giving rise to a signal that is detected on the amplifier input and that has a damping time significantly greater than the duration of the pulse, which can adversely affect the switching of the cell.

The aim of the invention is to make the cell immune to disturbances that occur outside the durations of transmitted pulses and are liable to influence the switching signal.

SUMMARY OF THE INVENTION

According to the invention the processing circuit of the receiver assembly includes a switch fitted in a derivation path of the gain loop of the amplifier and controlled by the pulsed transmission signal such that the circuit does not conduct when pulses from the transmission signal are present but conducts when no such pulses are present. This simple assembly therefore ensures the immunity of the amplifier output to external disturbances.

The device shaping the switching signal preferably includes an integration and filtering circuit capable of filtering the voltage signal over several pulses and a comparator that compares the integrated, filtered voltage signal with a threshold.

BRIEF DESCRIPTION OF THE DRAWINGS

Other characteristics of the present invention and the results that can be obtained by using it will be better understood from the following description of a non-limitative example of an embodiment of the invention.

DETAILED DESCRIPTION OF THE PREFERRED EMBODIMENT

Figure 1:
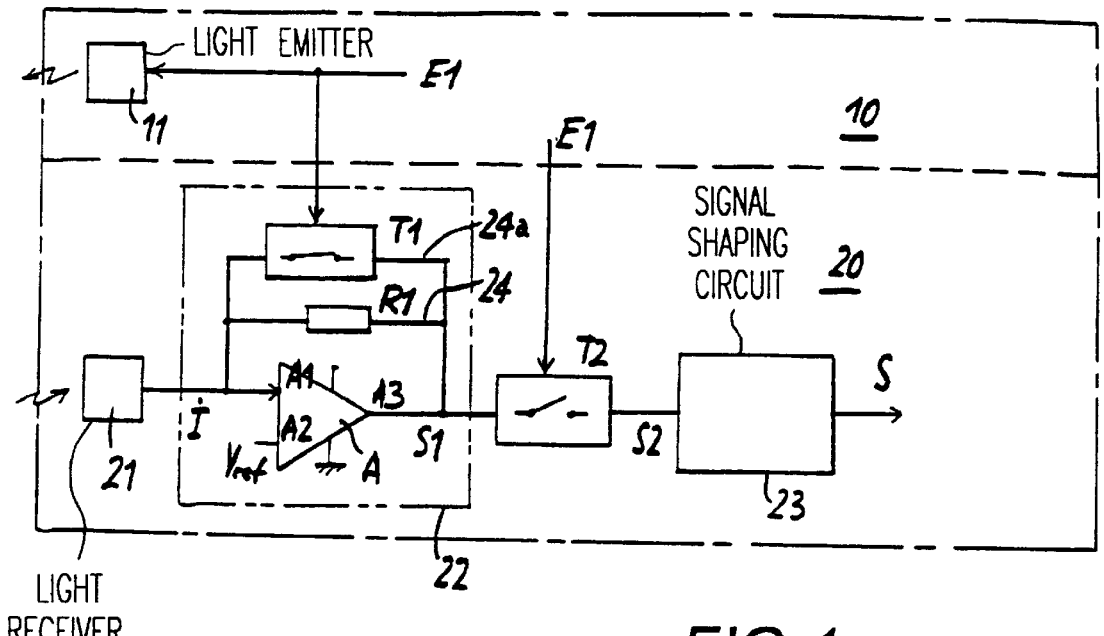
FIG. 1 is a schematic diagram of a photoelectric cell according the invention.

The photoelectric cell shown comprises a transmitting assembly 10 and a receiving assembly 20. The transmitting assembly generates a pulsed signal E1 with a low cyclic ratio that is transmitted to a light-emitting component 11 such as a photodiode. The receiver assembly 20 comprises a light-receiving component 21 such as an optotransistor that responds to the pulses of signal E1 by producing a current signal I that is high or low depending on the presence or absence of an object in the path of the optical beam emitted by component 11. Assembly 20 also comprises a circuit 22 that uses signal I to generate a voltage signal S1 capable of being processed by device 23 to provide a high or low switching signal S and generating the output magnitude of the cell.

Circuit 22 consists of a load amplifier A or transfer impedance amplifier that receives current signal I at input A1 and a reference voltage Vref at input A2 and provides voltage signal S1 at its signal output. Output A3 of the amplifier is connected to device 23 which comprises an integration and filtering circuit 25 and a comparator 26 that compares the resulting filtered signal with a voltage threshold Vc and provides the ON/OFF switching signal S.

Input A1 of the amplifier is connected to output A3 of the amplifier by a gain loop 24 fitted with a resistor R1. A short-circuit path 24a is connected in parallel with this loop. The short-circuit path includes a transistor T1 that is activated by signal E1 so that it does not conduct when transmission pulses are present but conducts when no such pulses are present. Between the connection point of path 24a to output A3 of the amplifier and comparator 26 are successively disposed a transistor T2 activated by signal E1 that only conducts when transmission pulses are present, integration and filtering circuit 25 that uses voltage signal S1 to produce an integrated voltage signal S2, followed by an integrated voltage signal S3 to clear signal S of unwanted characteristics, in particular brief electrical disturbances affecting the cell, especially when they occur just before reception of a detectable pulse.

Figure 2:
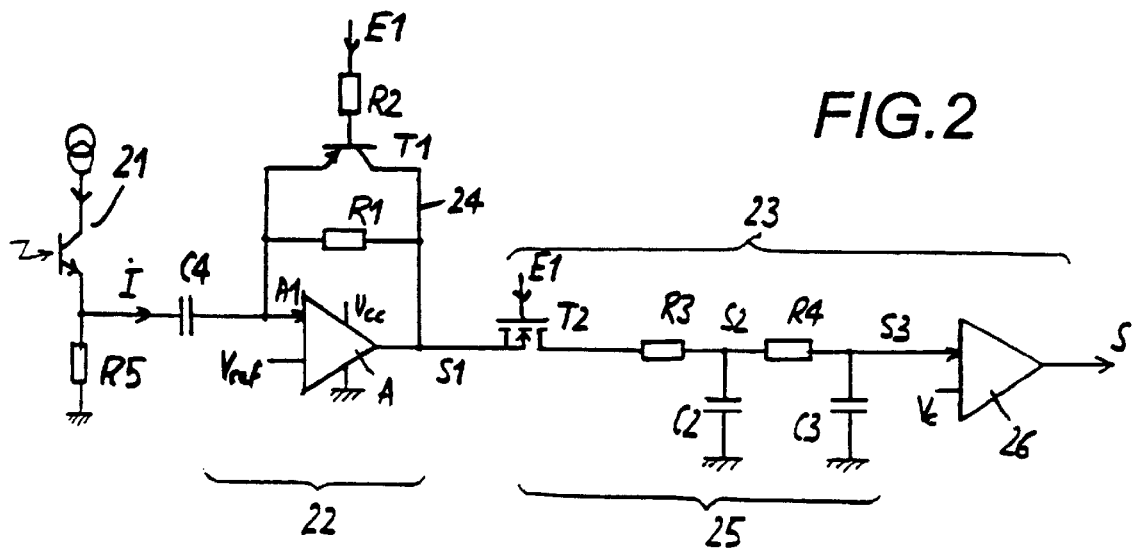
FIG. 2 is a more detailed diagram of an example of the invention.

In the embodiment shown in FIG. 2 transistor T1 is a pnp bipolar transistor whose base is activated by E1 via a resistor R2. Transistor T2 is a MOS transistor. Circuit 23 comprises an integrator R3, C2 associated with T2 and a filtering network R4, C3. In an embodiment that is less advantageous in that it is larger and less accurate, circuit 23 may consist of flip-flops.

Together with capacitor C4, disposed before input A1 of the amplifier, and gain resistor R1, resistor R5 constituting the transmitting foot of optotransistor 21 constitutes a high-pass filter that eliminates low-frequency noise.

Figure 3:
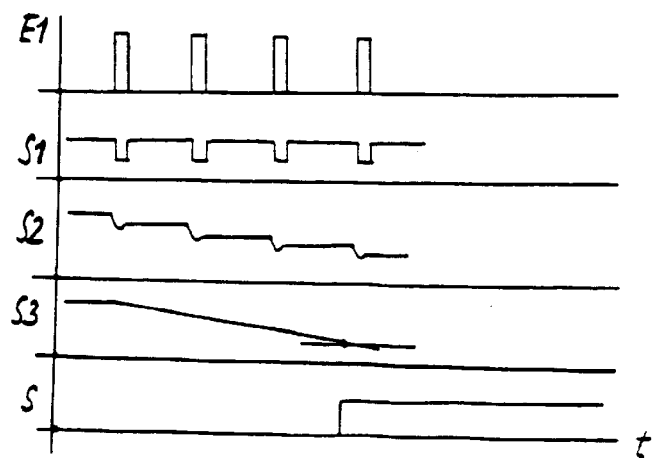
FIG. 3 is a graph showing variations in electrical amplitude associated with the diagram.

The functioning of the cell will now be explained with reference to FIG. 3.

In the absence of pulses from transmission signal E1 transistor T2 does not conduct and the input of comparator 26 therefore remains at its high level. If a brief power-line disturbance is detected it is re-routed by transistor T1 that short-circuits amplifier gain resistor R1 by using path 24a. The amplifier therefore operates in tracking mode. This prevents generation of a signal with a long damping time that has a deleterious effect on the next pulse.

In the presence of pulses from transmission signal E1 transistor T1 does not conduct but transistor T2 conducts. When an object is placed in the path of the emitted beam, current signal I adopts the corresponding level and is transformed into voltage signal S1 by amplifier A. Signal S1 correctly represents the response to the transmission signal, having passed over the disturbing data present on the leading edge of the signal. Signal S2 decays in stages governed by the successive pulses and signal S3 is filtered so that it decays regularly at the comparator input as shown in FIG. 3. As soon as S3 reaches threshold Vc the switching signal S provided by the processing circuit changes level.

I claim:

1. A photoelectric cell structure comprising:

a transmitting assembly for generating a pulsed transmission signal (E1) and including a light-emitting component for receiving said pulse transmission signal;

a receiving assembly including a light-receiving component and a processing circuit for processing a reception signal output from said light-receiving component wherein said processing circuit includes an amplifier device having a first input for receiving said reception signal and an output which provides a voltage signal (S1) said receiving assembly further including a shaping device receiving said voltage signal and providing a switching signal (S), and wherein said amplifier device is a transfer impedance amplifier circuit including a gain loop and a short-cut path in parallel with said gain loop wherein said short-cut path includes a first switch controlled by said pulsed transmission signal (E1) whereby said switch does not conduct when pulses of said pulsed transmission signal are present but said switch does conduct when no pulses from said pulse transmission signal are present.

2. The photoelectric cell according to claim 1, wherein said processing circuit further includes a means for stopping processing which includes a transistor receiving the output of said amplifier and wherein said stop processing means is controlled by said pulse transmission signal whereby said transistor conducts when pulses of said pulse transmission signal are present.

3. The photoelectric cell according to claim 1, wherein said shaping device which shapes said switching signal includes an integration and filtering circuit which filters said voltage signal over a plurality of pulses and said shaping device further includes a comparative for comparing an output of said integration and filtering circuit with a threshold reference value.

* * * * *